United States Patent
Ji

(10) Patent No.: US 10,309,015 B2
(45) Date of Patent: Jun. 4, 2019

(54) SUBSTRATE TREATING APPARATUS AND SUBSTRATE TREATING METHOD

(71) Applicant: PSK INC., Gyeonggi-do (KR)

(72) Inventor: Sung Gu Ji, Gyeonggi-do (KR)

(73) Assignee: PSK INC., Gyeonggi-Do (KR)

( * ) Notice: Subject to any disclaimer, the term of this patent is extended or adjusted under 35 U.S.C. 154(b) by 84 days.

(21) Appl. No.: 15/641,594

(22) Filed: Jul. 5, 2017

(65) Prior Publication Data

US 2018/0202045 A1   Jul. 19, 2018

(30) Foreign Application Priority Data

Jan. 17, 2017   (KR) .................. 10-2017-0008305

(51) Int. Cl.
| | |
|---|---|
| *C23C 16/50* | (2006.01) |
| *C23C 16/44* | (2006.01) |
| *C23C 16/455* | (2006.01) |
| *C23C 16/458* | (2006.01) |
| *C23C 16/507* | (2006.01) |
| *H01J 37/32* | (2006.01) |

(52) U.S. Cl.
CPC .......... *C23C 16/50* (2013.01); *C23C 16/4412* (2013.01); *C23C 16/4558* (2013.01); *C23C 16/4585* (2013.01); *C23C 16/45587* (2013.01); *C23C 16/507* (2013.01); *H01J 37/321* (2013.01); *H01J 37/3244* (2013.01); *H01J 37/32357* (2013.01); *H01J 37/32834* (2013.01)

(58) Field of Classification Search
CPC ............................................. C23C 16/4412
See application file for complete search history.

(56) References Cited

U.S. PATENT DOCUMENTS

| | | | |
|---|---|---|---|
| 2002/0038791 A1* | 4/2002 | Okumura | C23C 16/4412 216/71 |
| 2010/0183825 A1* | 7/2010 | Becker | C23C 16/4404 427/569 |
| 2011/0042009 A1* | 2/2011 | Lee | H01J 37/3244 156/345.43 |

FOREIGN PATENT DOCUMENTS

| | | |
|---|---|---|
| KR | 2011-0046353 A | 5/2011 |
| KR | 2011-0062534 A | 6/2011 |
| KR | 2014-0105585 A | 9/2014 |

* cited by examiner

*Primary Examiner* — Joseph A Miller, Jr.
(74) *Attorney, Agent, or Firm* — Carter, Deluca & Farrell LLP

(57) ABSTRACT

Disclosed are a substrate treating apparatus and a substrate treating method. The substrate treating apparatus includes a process chamber, a substrate support unit configured to support a substrate in the process chamber, a gas supply unit configured to supply a process gas into the process chamber, and an exhaust adjusting unit configured to adjust a discharge amount of the process gas and residual gases in the process chamber, wherein the exhaust adjusting unit includes a ring-shaped first exhaust ring provided on a side of the substrate support unit and having a plurality of exhaust holes, a ring-shaped second exhaust ring provided below the first exhaust ring and having a plurality of exhaust holes, and an adjustment part configured to adjust relative locations of the plurality of exhaust holes provided in the second exhaust ring with respect to the plurality of exhaust holes provided in the first exhaust ring.

6 Claims, 7 Drawing Sheets

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2017-0008305 filed Jan. 17, 2017, in the Korean Intellectual Property Office, the entire contents of which are hereby incorporated by reference.

BACKGROUND

Embodiments of the inventive concept described herein relate to a substrate treating apparatus and a substrate treating method, and more particularly to a substrate treating apparatus that may adjust a discharge amount of a gas in a process chamber of the substrate treating apparatus and a substrate treating method.

Plasma refers to a gaseous state in which ions, electrons, radicals, or the like are ionized, and the plasma is generated by a very high temperature, a strong electric field, or a radio frequency (RF) electromagnetic field.

The plasma is variously utilized in a lithography process that uses a photoresist to manufacture a semiconductor device. As an example, the utility of the plasma gradually increases when various fine circuit patterns such as lines or space patterns on a substrate or during an ashing process of removing a photoresist film used for a mask is removed in an ion implantation process.

In this way, in a substrate treating apparatus using plasma, the flows of the gas in the chamber has to be controlled because the residual time of the process gas and the residual gases in the process chamber significantly influences the uniformity of the substrate treating process.

There is a method for changing a process recipe or hardware that may influence flows of a gas for control of the flows of the gas, but this method causes a significant loss in an aspect of costs and time.

SUMMARY

Embodiments of the inventive concept provide a substrate treating apparatus that may precisely control a uniformity of a substrate treating process by adjusting flows of a gas in a process chamber more simply.

The objects of the inventive concept are not limited to the above-described ones. Other technical objects that are not mentioned will be clearly understood from the following description by those skilled in the art to which the inventive concept pertains.

In accordance with an aspect of the inventive concept, there is provided a substrate treating apparatus including a process chamber, a substrate support unit configured to support a substrate in the process chamber, a gas supply unit configured to supply a process gas into the process chamber, and an exhaust adjusting unit configured to adjust a discharge amount of the process gas and residual gases in the process chamber, wherein the exhaust adjusting unit includes a ring-shaped first exhaust ring provided on a side of the substrate support unit and having a plurality of exhaust holes, a ring-shaped second exhaust ring provided below the first exhaust ring and having a plurality of exhaust holes, and an adjustment part configured to adjust relative locations of the plurality of exhaust holes provided in the second exhaust ring with respect to the plurality of exhaust holes provided in the first exhaust ring.

According to an embodiment, the plurality of exhaust holes of the first exhaust ring may have shapes corresponding to the plurality of exhaust holes of the second exhaust ring.

According to an embodiment, the exhaust adjusting unit may further include a storage part configured to store a correspondence of alignment states of the exhaust holes of the first exhaust ring and the second exhaust ring according to a substrate treating process progress degree, and the adjustment part may adjust relative locations of the plurality of exhaust holes provided in the second exhaust ring with respect to the plurality of exhaust holes provided in the first exhaust ring, based on the correspondence of the alignment states of the exhaust holes according to the substrate treating process progress degree.

According to an embodiment, the adjustment part may include a rotary member connected to the second exhaust ring to rotate the second exhaust ring.

According to an embodiment, the rotary member may include a support member connected to lower surfaces of opposite ends of the second exhaust ring, a support plate connected to the support member and having a ring shape corresponding to the second exhaust ring, and a driving unit configured to rotate the support plate.

According to an embodiment, the support plate may have a gear at a side end thereof, and the driving unit may include a driving gear enmeshed with the gear, a motor configured to provide driving power for rotating the driving gear, and a connection member configured to transmit the driving power generated by the motor to the driving gear.

According to an embodiment, the rotary member may include a disk-shaped driving plate provided on an outside of the support plate, and a belt surrounding outer peripheral surfaces of the support plate and the driving plate, and the driving unit may include a motor configured to drive the driving plate, and a connection member configured to transmit the driving power generated by the motor to the driving plate.

According to an embodiment, the substrate treating apparatus may further include a plasma generating unit configured to generate plasma supplied to the substrate.

In accordance with another aspect of the inventive concept, there is provided a method for treating a substrate by using the substrate treating apparatus, the method including loading a substrate in a process chamber, treating the substrate for a first treatment time by adjusting arrangement state of exhaust holes of a first exhaust ring and a second exhaust ring to a first alignment state, changing the first alignment state to a second alignment state, treating the substrate for a second treatment time in the second alignment state, and extracting the substrate.

In accordance with another aspect of the inventive concept, there is provided a substrate treating apparatus including a process chamber, a substrate support unit configured to support a substrate in the process chamber, a gas supply unit configured to supply a process gas into the process chamber, and an exhaust adjusting unit configured to adjust a discharge amount of the process gas and residual gases in the process chamber, and the exhaust adjusting unit includes a ring-shaped exhaust ring provided on a side of the substrate support unit and having a plurality of exhaust holes, a ring-shaped support plate provided below the exhaust ring and corresponding to the exhaust ring, and an adjustment part configured to adjust a distance between the exhaust ring and the support plate by vertically moving the support plate.

According to an embodiment, the adjustment part may include a rail part connected to lower surfaces of opposite ends of the exhaust ring, and a driving part configured to vertically move the support plate along the rail part.

According to an embodiment, the adjustment part may change a distance between the exhaust ring and the support plate by moving the support plate according to a substrate treating process progress degree.

According to an embodiment, the exhaust adjusting unit may further include an upper exhaust ring provided above the exhaust ring and having a plurality of exhaust holes.

According to an embodiment, the plurality of exhaust holes of the upper exhaust ring may have shapes corresponding to the plurality of exhaust holes of the exhaust ring.

In accordance with another aspect of the inventive concept, there is provided a method for treating a substrate by using the substrate treating apparatus, the method including loading a substrate in a process chamber, treating the substrate for a first treatment time by adjusting an exhaust ring and a support plate such that the exhaust ring and the support plate have a first location relationship, changing the first location relationship to a second location relationship, treating the substrate for a second treatment time in the second location relationship, and extracting the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The above and other aspects, features and advantages of the invention will become apparent from the following description of the following embodiments given in conjunction with the accompanying drawings. However, the inventive concept is not limited to the embodiments disclosed below, but may be implemented in various forms. The embodiments of the inventive concept is provided to make the disclosure of the inventive concept complete and fully inform those skilled in the art to which the inventive concept pertains of the scope of the inventive concept.

Although not defined, all the terms (including technical or scientific terms) used herein may have the same meanings that are generally accepted by the common technologies in the field to which the inventive concept pertains. The terms defined by the general dictionaries may be construed to having the same meanings as those meant in the related technologies and/or the disclosure of the application, and will neither become conceptual nor be construed to be excessively formal even though not clearly defined herein. The terms used herein are provided to describe the embodiments but not to limit the inventive concept.

In the specification, the singular forms include plural forms unless particularly mentioned. The expressions 'include' and/or its various conjugated forms, such as 'including', which are used in the specification do not exclude existence or addition of one or more compositions, substances, elements, steps, operations, and/or devices. Further, the expressions such as 'comprising' and 'having' have to be construed in the same way.

Figure 1:
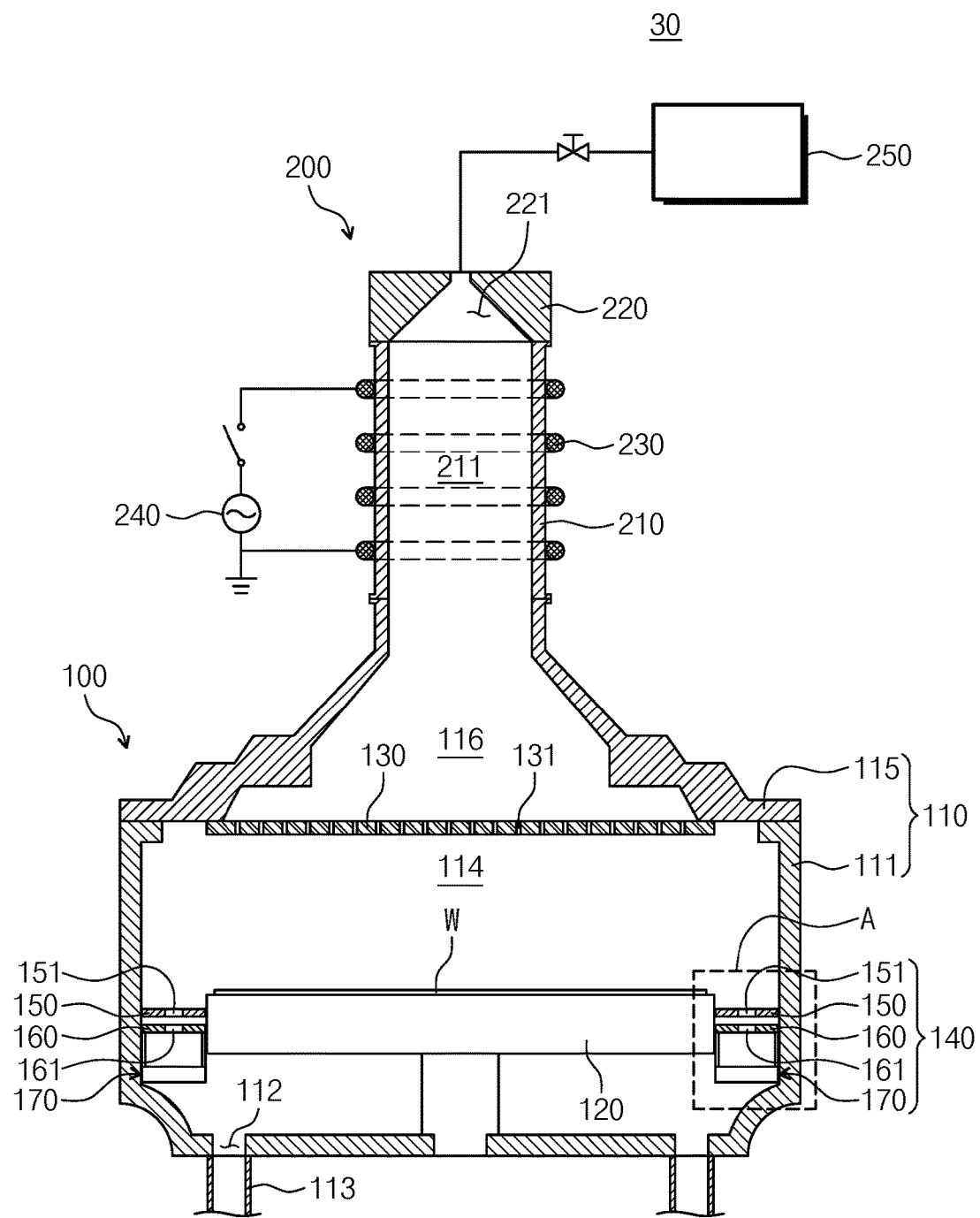
FIG. 1 is a sectional view illustrating a substrate treating apparatus according to an embodiment of the inventive concept.

FIG. 1 is a sectional view illustrating a substrate treating apparatus according to an embodiment of the inventive concept.

Referring to FIG. 1, an inductively coupled plasma (ICP) type apparatus is provided as the substrate treating apparatus 30. The substrate treating apparatus 30 includes a process executing unit 100 and a plasma supply unit 200. The process executing unit 100 provides a space in which a substrate W is treated, and the plasma supply unit 200 generates plasma used in a substrate (W) treating process and supplies the plasma to the substrate W in a downstream manner. Hereinafter, the configurations will be described in detail.

The process executing unit 100 includes a process chamber 110, a substrate support unit 120, a baffle 130, and an exhaust adjusting unit 140.

The process chamber 110 provides a space in which a process is executed. The process chamber 110 has a body 111 and a closed cover 115. An upper surface of the body 111 is opened and the body 111 has a space in the interior thereof. An opening (not illustrated) through which the substrate W is introduced and discharged is formed on a side wall of the body 111, and the opening is opened and closed by an opening/closing member such as a slit door (not illustrated). The opening/closing member closes the opening while the substrate W is treated in the process chamber 110, and opens the opening when the substrate W is carried into the process chamber 110 and carried out of the process chamber 110. An exhaust hole 112 is formed on a lower wall of the body 111. The exhaust hole 112 is connected to an exhaust line 113. An internal pressure of the process chamber 110 is adjusted through the exhaust line 113, and fumes and reaction side-products generated in the process are exhausted to the outside of the process chamber 110.

The closed cover 115 is coupled to an upper wall of the body 111, and covers the opened upper surface of the body 111 to close the interior of the body 111. An upper end of the closed cover 115 is connected to the plasma supply unit 200. The closed cover 115 has an induction space 116. The induction space 116 has an inverse funnel shape. The plasma introduced from the plasma supply unit 200 is diffused in the induction space 116 and flows to the baffle 130.

The substrate support unit 120 is located in the interior of the process chamber 110 and supports the substrate W. The substrate support unit 120 may include an electrostatic chuck configured to fix the substrate W by an electrostatic force. Further, the substrate support unit 120 may include a vacuum chuck configured to fix the substrate W to variously support the substrate. The substrate support unit 120 may have lift holes (not illustrated). Lift pins (not illustrated) are provided in the lift holes, respectively. When the substrate W is loaded on or unloaded from the substrate support unit 120, the lift pins elevates along the lift holes. A heater may be provided in the interior of the substrate support unit 120. The heater heats the substrate W to maintain the substrate W at a temperature that is suitable for a process.

The baffle 130 is coupled to an upper wall of the body 111. The baffle 130 has a disk shape having a small thickness, and disposed in parallel to the substrate support unit 120 while facing the upper surface of the substrate support unit 120. A surface of the baffle 130, which faces the upper surface of the substrate support unit 120, is flat. The baffle 130 may have a radius corresponding to the substrate W. The baffle 130 has distribution holes 131. The distribution holes 131 are through-holes extending from an upper surface to a bottom surface of the baffle 130, and uniformly formed in areas of the baffle 130. The plasma supplied from the plasma supply unit 200 to the process chamber 110 passes through the distribution holes 131 and is uniformly distributed into the interior of the process chamber 110.

The exhaust adjusting unit 140 is provided in the interior of the process chamber 110. The exhaust adjusting unit 140 functions to surround the plasma such that the plasma is left in a treatment space 114, and generates uniform flows by adjusting a discharge amount of process gas and residual gas in the chamber in a process of exhausting fumes generated in the process. The treatment space 114 is a space located above the substrate W, and is a space into which most of the plasma that passed through the baffle 130 is introduced. The exhaust adjusting unit 140 includes a first exhaust ring 150, a second exhaust ring 160, a storage part (not illustrated), and an adjustment part 170.

The first exhaust ring 150 is a circular ring-shaped plate having a small thickness. An inner diameter of the first exhaust ring 150 has a radius that corresponds to an outer diameter of the substrate support unit 120, or a radius of the first exhaust ring 150 may be larger than the outer diameter of the substrate support unit 120. The first exhaust ring 150 is provided on a side of the substrate support unit 120. A plurality of exhaust holes 151 are formed in the first exhaust ring 150. The exhaust holes 151 are through-holes extending from an upper surface to a bottom surface of the first exhaust ring 150, and uniformly formed along a circumference of the first exhaust ring 150. The exhaust holes 151 may have a circular cross-section. Unlike this, the exhaust holes 151 may have various shapes.

The second exhaust ring 160 is a circular ring-shaped plate having a small thickness. The second exhaust ring 160 is provided on a side of the substrate support unit 120, and below the first exhaust ring 150. The second exhaust ring 160 has an inner diameter corresponding to an outer diameter of the substrate support unit 120, and is provided along a circumference of the substrate support unit 120. A plurality of exhaust holes 161 are formed in the second exhaust ring 160. The exhaust holes 161 are through-holes extending from an upper surface to a bottom surface of the second exhaust ring 160, and uniformly formed along a circumference of the second exhaust ring 160. The exhaust holes 161 may have a circular cross-section. Unlike this, the exhaust holes 161 may have various shapes.

The storage part stores a correspondence of the alignment states of the exhaust holes 151 and 161 of the first exhaust ring 150 and the second exhaust ring 160 according to a substrate treating process progress degree. The opening degrees of the exhaust holes of the first exhaust ring 150 and the second exhaust ring 160 when viewed from the top of the first exhaust ring 150 vary according to the alignment states of the exhaust holes 151 and 161. That is, the storage part stores the alignment states of the exhaust holes 151 and 161 of the first exhaust ring 150 and the second exhaust ring 160, which allow suitable discharge amounts of the first exhaust ring 150 and the second exhaust ring 160 according to the process progress degree of the substrate.

The adjustment part 170 may adjust relative locations of the plurality of exhaust holes 161 provided in the second exhaust ring 160 with respect to the plurality of exhaust holes 151 provided in the first exhaust ring 150, based on the correspondence of the alignment states of the exhaust holes according to the substrate treating process progress degree stored in the storage part. Further, the adjustment part may adjust the discharge amounts of the exhaust holes by vertically moving the adjustment part itself as well as the relative locations of the plurality of exhaust holes provide in the second exhaust ring 160 with respect to the plurality of exhaust holes 151. As an embodiment, the adjustment part 170 may include a rotary member connected to the second exhaust ring 160 to rotate the second exhaust ring in order to rotate the second exhaust ring 160 to adjust the alignment states of the plurality of exhaust holes 161 of the second exhaust ring 160 with respect to the plurality of exhaust holes 151 of the first exhaust ring 150. Hereinafter, the inventive concept will be described with reference to FIGS. 3 and 4.

The plasma supply unit 200 is located above the process chamber 110, and generates plasma from a process gas. The plasma supply unit 200 includes a reactor 210, a gas injection port 220, an induction coil 230, a power source 240, and a gas supply part 250.

The reactor 210 has a cylindrical shape, and an upper surface and a lower surface of the reactor 210 is opened and a space is formed in the interior of the reactor 210. The interior of the reactor 210 is provided as an electrical discharge space 211 in which the process gas is electrically discharged. A lower end of the reactor 210 is connected to an upper end of the closed cover 115, and the electrical discharge space 211 is connected to the induction space 116. The process gas electrically discharged from the electrical discharge space 211 is introduced into the interior of the process chamber 110 through the induction space 116.

A gas injection port 220 is coupled to an upper end of the reactor 210. The gas injection port 220 is connected to the gas supply part 250, and a gas is introduced through the gas injection port 220. An induction space 221 is formed on a bottom surface of the gas injection port 220. The induction space 221 has an inverse funnel shape, and communicates with the electrical discharge space 211. The gas introduced into the induction space 221 is diffused and is introduced into the electrical discharge space 211.

The induction coil 230 is wound on the reactor 210 along a circumference of the reactor 210 a plurality of times. One end of the induction coil 230 is connected to the power source 240, and an opposite end of the induction coil 230 is grounded. The power source 240 applies high-frequency power or microwave power to the induction coil 230.

The gas supply part 250 supplies a gas to the electrical discharge space 211. The process gas stored in a gas storage part 251 is supplied to the electrical discharge space 211 through a gas supply line 252. The process gas may include any one of gases of $NH_3$, $O_2$, $N_2$, $H_3$, and $NF_3CH_4$. The process gas may be used during ashing process.

Figure 2:
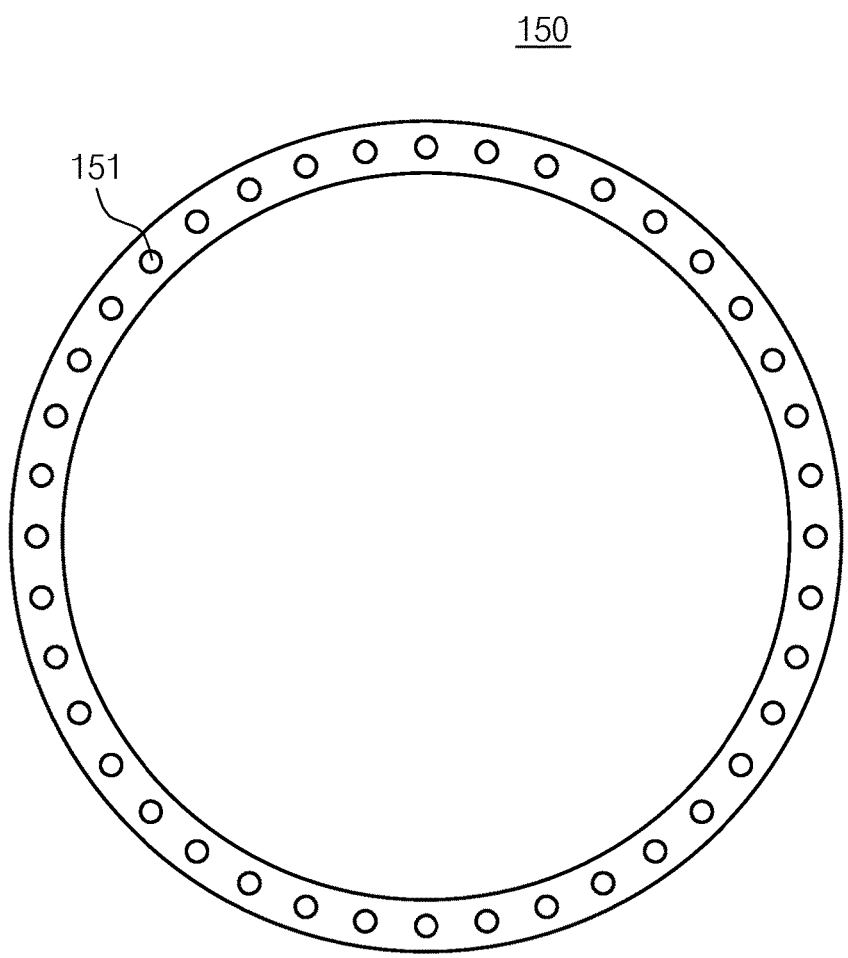
FIG. 2 is a plan view illustrating a structure of a first exhaust ring according to an embodiment of the inventive concept.

FIG. 2 is a plan view illustrating a structure of the first exhaust ring 150 according to an embodiment of the inventive concept.

As illustrated in FIG. 2, the first exhaust ring 150 is a circular ring-shaped plate, and includes a plurality of exhaust holes 151 uniformly formed along a circumference of the first exhaust ring 150. As an embodiment, a distance between any two exhaust holes 151 of the plurality of exhaust holes 151 may be equal to or greater than the diameter of the exhaust holes. Accordingly, the opening degrees by the first exhaust ring 150 and the second exhaust ring 160 illustrated in FIG. 3 may be controlled more precisely. The second exhaust ring 160 illustrated in FIG. 3 has the same shape as that of the first ring 150, and the plurality of exhaust holes of the second exhaust ring 160 also have the same shape as that of the plurality of exhaust holes 151 of the first exhaust ring 150.

Figure 3:
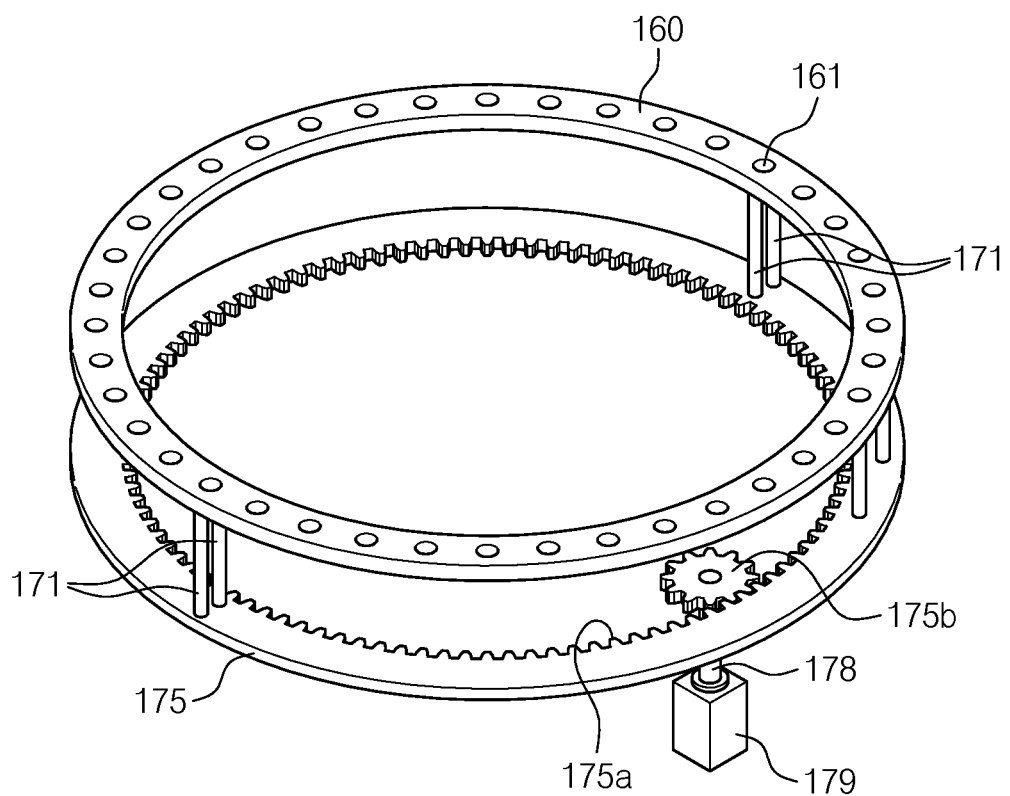
FIG. 3 is a view illustrating a detailed structure of an adjustment part according to an embodiment of the inventive concept.

FIG. 3 is a view illustrating a detailed structure of an adjustment part according to an embodiment of the inventive concept.

As illustrated in FIG. 3, the adjustment part may include a rotary member connected to the second exhaust ring 160 to rotate the second exhaust ring in order to adjust relative locations of the plurality of exhaust holes provided in the second exhaust ring with respect to the plurality of exhaust holes provided in the first exhaust ring. The rotary member may include a support member 171, a support plate 175, and a driving unit configured to rotate the support plate 175.

The support member 171 may be connected to lower surfaces of opposite ends of the second exhaust ring 160, but the shape of the support member 171 is not limited thereto and may be connected to a lower surface of a part, in which an exhaust hole 161 of the second exhaust ring 160 is not formed.

The support plate 175 may be connected to the support member 171, and may have a circular ring shape corresponding to the second exhaust ring 160. The support plate 175 may further include a gear 175a at a side end of an inner surface thereof.

The driving unit may include a driving gear 175b enmeshed with the gear 175a of the support plate 175, a motor 179 configured to provide power for rotating the driving gear 175b, and a connection member 178 configured to transmit driving power generated by the motor 179 to the driving gear 175b.

Figure 4:
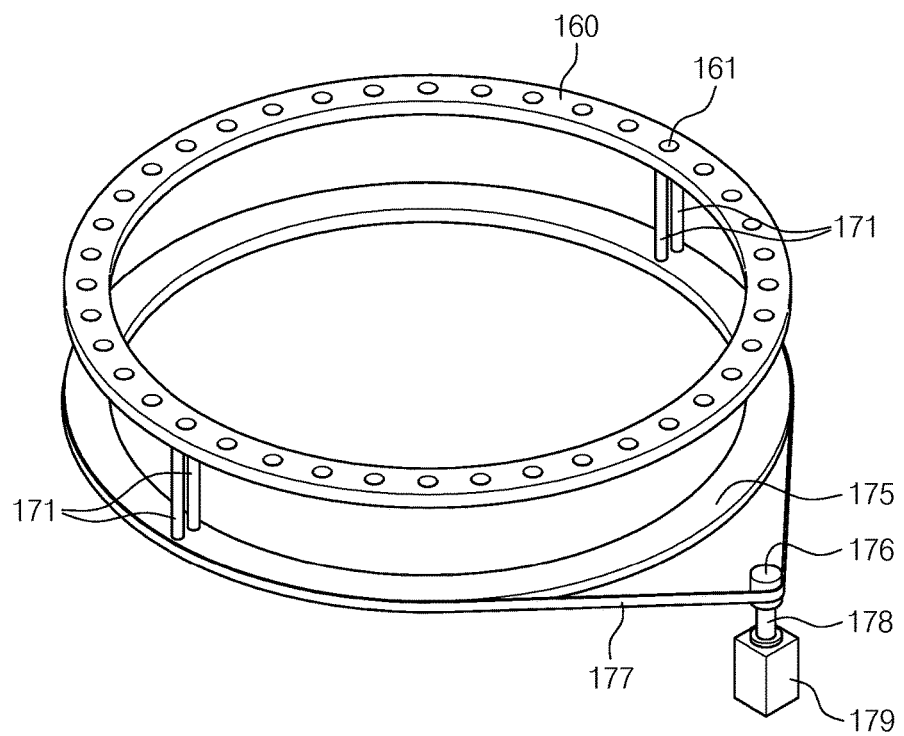
FIG. 4 is a view illustrating a detailed structure of an adjustment part according to another embodiment of the inventive concept.

FIG. 4 is a view illustrating a detailed structure of an adjustment part according to another embodiment of the inventive concept.

As illustrated in FIG. 4, the adjustment part according to the second embodiment of the inventive concept may include a rotary member including a driving plate 176 and a belt 177, in addition to the support member 171 and the support plate 175.

The driving plate 176 may be provided on an outside of the support plate 175 to be spaced apart from the support plate 175 while having a disk shape, and a diameter of the driving plate 176 may be smaller than the diameter of the support plate 175. The belt 177 surrounds outer peripheral surfaces of the support plate 175 and the driving plate 176. The driving unit may include a motor 179 configured to drive the driving plate 176, and a connection member 178 configured to transmit the driving power generated by the motor 179 to the driving plate 176. According to the above-mentioned structure, as the driving plate 176 is rotated, the support plate 175 may be rotated while the belt 177 is moved so that the relative locations of the plurality of exhaust holes provided in the second exhaust ring with respect to the plurality of exhaust holes provided in the first exhaust ring may be adjusted.

Figure 5:
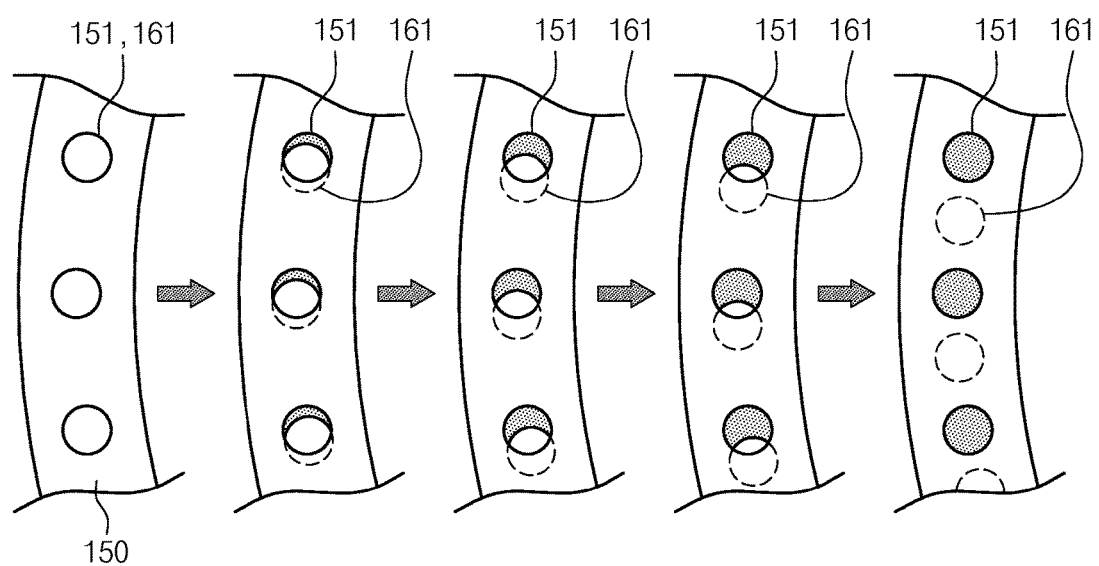
FIG. 5 is a view illustrating opening degrees by the first exhaust ring and the second exhaust ring when viewed from the top, according to a process progress degree according to the inventive concept.

FIG. 5 is a view illustrating opening degrees by the first exhaust ring and the second exhaust ring when viewed from the top, according to a process progress degree according to the inventive concept.

As illustrated in FIG. 5, when viewed from the top of the first exhaust ring 150, the opening degree by the first exhaust ring and the second exhaust ring is changed by the relative locations of the exhaust holes 161 of the second exhaust ring with respect to the exhaust holes 151 of the first exhaust ring, that is, the alignment states of the exhaust holes 151 of the first exhaust ring and the exhaust holes 161 of the second exhaust ring. Accordingly, the discharge amount of the process gas and the residual gases in the chamber may be efficiently controlled by adjusting the relative locations of the exhaust holes 161 of the second exhaust ring with respect to the exhaust holes 151 of the first exhaust ring.

Figure 6:
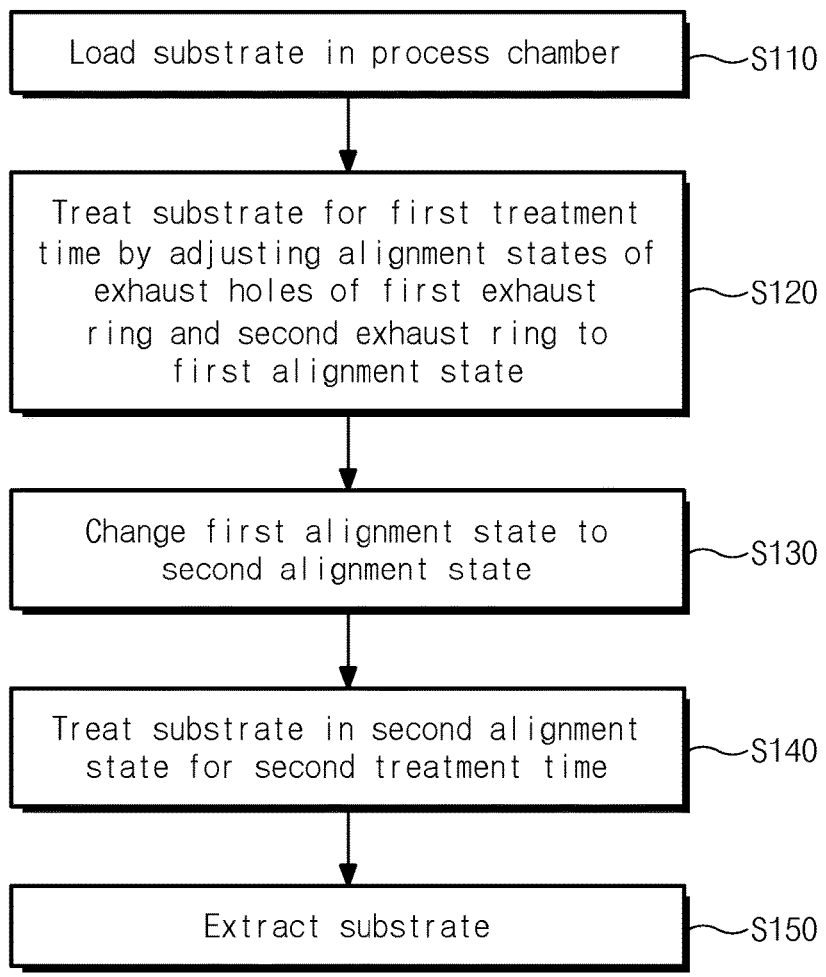
FIG. 6 is a flowchart illustrating a substrate treating apparatus according to an embodiment of the inventive concept.

FIG. 6 is a flowchart illustrating a substrate treating apparatus according to an embodiment of the inventive concept.

As illustrated in FIG. 6, the substrate treating method according to an embodiment of the inventive concept may include an operation S110 of loading a substrate in a process chamber, an operation S120 of treating the substrate for a first treatment time by adjusting arrangement state of exhaust holes of a first exhaust ring and a second exhaust ring to a first alignment state, an operation S130 of changing the first alignment state to a second alignment state, an operation S140 of treating the substrate for a second treatment time in the second alignment state; and an operation S150 of extracting the substrate. As an embodiment, the second alignment state may be an alignment state that is different from the first alignment state in an aspect of the locations of the plurality of exhaust holes provided in the second exhaust ring with respect to the plurality of exhaust holes provided in the first exhaust ring.

Figure 7:
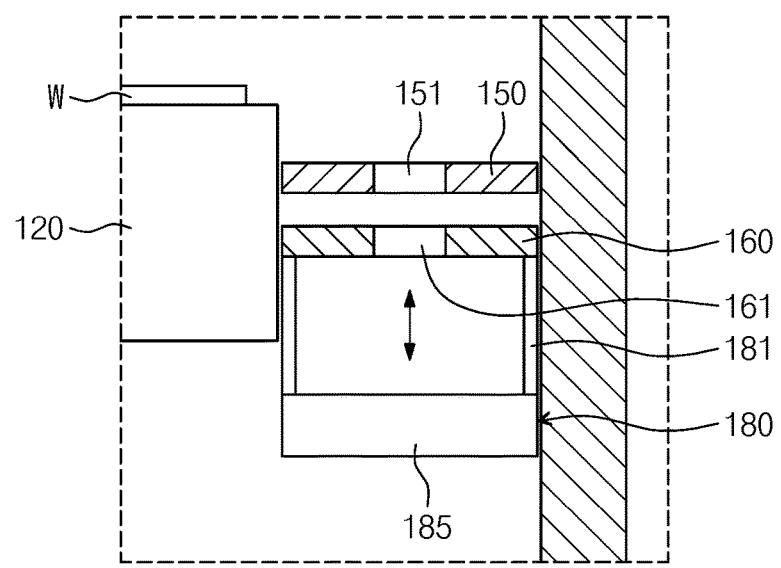
FIG. 7 is a sectional view illustrating a substrate treating apparatus according to another embodiment of the inventive concept.

FIG. 7 is a sectional view illustrating a substrate treating apparatus according to another embodiment of the inventive concept.

Referring to FIG. 7, an exhaust adjusting unit of the substrate treating apparatus according to the third embodiment of the inventive concept may include a ring-shaped exhaust ring 160 provided on a side of a support unit and having a plurality of exhaust holes 161, a ring-shaped support plate 185 provided under the exhaust ring 160 and corresponding to the exhaust ring, and an adjustment part 180 configured to adjust a distance between the exhaust ring 160 and the support plate 185 by vertically moving the support plate 186.

The adjustment part 180 may adjust a discharge amount of the gas in a chamber by moving the support plate 185 to change a distance between the exhaust ring 160 and the support plate 185 according to a substrate treating process progress degree. The adjustment part 180 may include a rail part 181 connected to the support plate 185 and lower surfaces of opposite ends of the exhaust ring 160 by moving the support plate 185 according to the substrate treating process progress degree, and a driving part (not illustrated) configured to vertically move the support plate 185 along the rail part 181.

According to an embodiment, the exhaust adjusting unit may further include a ring-shaped upper exhaust ring 150 having a plurality of exhaust holes 151 above the exhaust ring 160. The plurality of exhaust holes 151 of the upper exhaust ring 150 may have a shape corresponding to the plurality of exhaust holes 161 of the exhaust ring 160.

Figure 8:
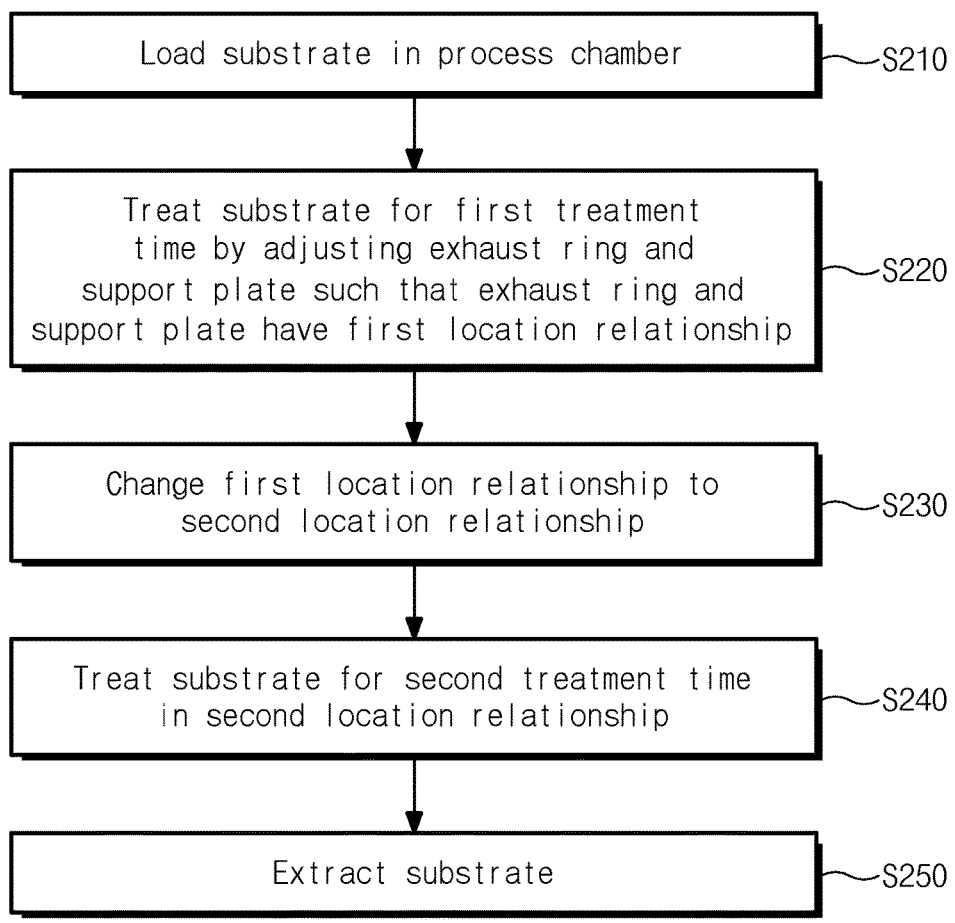
FIG. 8 is a flowchart illustrating a substrate treating apparatus according to another embodiment of the inventive concept.

FIG. 8 is a flowchart illustrating a substrate treating apparatus according to another embodiment of the inventive concept.

As illustrated in FIG. 8, the substrate treating method according to a fourth embodiment of the inventive concept may include an operation S210 of loading a substrate in a process chamber, an operation S220 of treating the substrate for a first treatment time by adjusting an exhaust ring and a support plate such that the exhaust ring and the support plate have a first location relationship, an operation S230 of changing the first location relationship to a second location relationship, an operation S240 of treating the substrate for a second treatment time in the second location relationship, and an operation S250 of extracting the substrate. In an embodiment, the second location relationship may be a location relationship that is different from the first location relationship in an aspect of a distance between the exhaust ring and the support plate.

According to an embodiment of the inventive concept, an evenness of the substrate treating process may be precisely controlled by adjusting flows of the gas in the process chamber more simply.

The effects of the prevent invention are not limited the above-mentioned ones. Unmentioned effects will be clearly understood from the specification and the accompanying drawings by those skilled in the art to which the inventive concept pertains.

It is noted that the above embodiments are suggested for understanding of the inventive concept and do not limit the scope of the inventive concept, and various modifiable embodiments also fall within the scope of the inventive concept. It should be understood that the technical protection range of the inventive concept has to be determined by the technical spirit of the claims, and the technical protection range of the inventive concept is not limited to the lexical meaning of the claims but even includes the equivalent inventions.

What is claimed is:

1. A substrate treating apparatus comprising:
   a process chamber;
   a substrate support unit configured to support a substrate in the process chamber;
   a gas supply unit configured to supply a process gas into the process chamber; and
   an exhaust adjusting unit configured to adjust a discharge amount of the process gas and residual gases in the process chamber,
   wherein the exhaust adjusting unit comprises:
      a ring-shaped first exhaust ring provided on a side of the substrate support unit and having a plurality of exhaust holes;
      a ring-shaped second exhaust ring provided below the ring-shaped first exhaust ring and having a plurality of exhaust holes; and
      an adjustment part configured to adjust relative locations of the plurality of exhaust holes provided in the ring-shaped second exhaust ring with respect to the plurality of exhaust holes provided in the ring-shaped first exhaust ring,
   wherein the plurality of exhaust holes of the ring-shaped first exhaust ring have shapes corresponding to the plurality of exhaust holes of the ring-shaped second exhaust ring,
   wherein the adjustment part comprises a rotary member connected to the ring-shaped second exhaust ring to rotate the ring-shaped second exhaust ring, and
   wherein the rotary member comprises:
      a support member connected to lower surfaces of opposite ends of the ring-shaped second exhaust ring;
      a support plate connected to the support member and having a ring shape corresponding to the ring-shaped second exhaust ring; and
      a driving unit configured to rotate the support plate.

2. The substrate treating apparatus of claim 1, wherein the exhaust adjusting unit further comprises a storage part configured to store a correspondence of alignment states of the exhaust holes of the ring-shaped first exhaust ring and the ring-shaped second exhaust ring according to a substrate treating process progress degree, and
   wherein the adjustment part adjusts relative locations of the plurality of exhaust holes provided in the ring-shaped second exhaust ring with respect to the plurality of exhaust holes provided in the ring-shaped first exhaust ring, based on the correspondence of the alignment states of the exhaust holes according to the substrate treating process progress degree.

3. The substrate treating apparatus of claim 1, wherein the support plate has a gear at a side end thereof, and
   wherein the driving unit comprises:
      a driving gear enmeshed with the gear;
      a motor configured to provide driving power for rotating the driving gear; and
      a connection member configured to transmit the driving power generated by the motor to the driving gear.

4. The substrate treating apparatus of claim 1, wherein the rotary member comprises:
   a disk-shaped driving plate provided on an outside of the support plate; and
   a belt surrounding outer peripheral surfaces of the support plate and the disk-shaped driving plate, and
   wherein the driving unit comprises:
      a motor configured to drive the disk-shaped driving plate; and
      a connection member configured to transmit driving power generated by the motor to the disk-shaped driving plate.

5. The substrate treating apparatus of claim 1, further comprising:
   a plasma generating unit configured to generate plasma supplied to the substrate.

6. A method for treating a substrate by using the substrate treating apparatus of claim 1, the method comprising:
   loading a substrate in a process chamber;
   treating the substrate for a first treatment time by adjusting arrangement state of exhaust holes of a first exhaust ring and a second exhaust ring to a first alignment state;
   changing the first alignment state to a second alignment state;
   treating the substrate for a second treatment time in the second alignment state; and
   extracting the substrate.

* * * * *